US007622359B2

United States Patent
Kato et al.

(10) Patent No.: US 7,622,359 B2
(45) Date of Patent: Nov. 24, 2009

(54) METHOD FOR MANUFACTURING SEMICONDUCTOR DEVICE

(75) Inventors: Juri Kato, Chino (JP); Kei Kanemoto, Suwa (JP)

(73) Assignee: Seiko Epson Corporation (JP)

( * ) Notice: Subject to any disclaimer, the term of this patent is extended or adjusted under 35 U.S.C. 154(b) by 107 days.

(21) Appl. No.: 12/025,093

(22) Filed: Feb. 4, 2008

(65) Prior Publication Data

US 2008/0194082 A1    Aug. 14, 2008

(30) Foreign Application Priority Data

Feb. 14, 2007    (JP) ............................. 2007-033238

(51) Int. Cl.
*H01L 21/762* (2006.01)
(52) U.S. Cl. ...................... 438/405; 438/412; 438/421; 438/422; 257/E21.533
(58) Field of Classification Search ................. 438/405, 438/412, 421, 422; 257/E21.533
See application file for complete search history.

(56) References Cited

U.S. PATENT DOCUMENTS

2006/0223270 A1*  10/2006  Hara ........................ 438/294

2007/0080402 A1*  4/2007  Kato ........................ 257/351
2007/0176236 A1*  8/2007  Oka et al. ................. 257/347
2007/0296000 A1*  12/2007  Hara ........................ 257/211
2009/0170293 A1*  7/2009  Matsuzawa ............... 438/486

FOREIGN PATENT DOCUMENTS

JP    2005-354024    12/2005

OTHER PUBLICATIONS

T. Sakai et al. "Separation by Bonding Si Islands (SBSI) for LSI Applications", Second International SiGe Technology and Device Meeting, Meeting Abstract, pp. 230-231, May (2004).

* cited by examiner

*Primary Examiner*—George Fourson
(74) *Attorney, Agent, or Firm*—Harness, Dickey & Pierce, P.L.C.

(57) ABSTRACT

A method for manufacturing a semiconductor device, includes: (a) forming a SiGe layer on a Si substrate; (b) forming a Si layer on the SiGe layer; (c) forming a dummy pattern made of SiGe in a dummy region of the Si substrate; and (d) wet-etching and removing the SiGe layer formed under the Si layer. In the step (d), an etchant is kept to contact the dummy pattern from before a complete remove of the SiGe layer to an end of the etching.

8 Claims, 15 Drawing Sheets

METHOD FOR MANUFACTURING SEMICONDUCTOR DEVICE

The entire disclosure of Japanese Patent Application No. 2007-033238, filed Feb. 14, 2007 is expressly incorporated by reference herein.

BACKGROUND

1. Technical Field

The present invention relates to a method for manufacturing a semiconductor device. More particularly, the present invention relates to a technique for forming a silicon-on-insulator (SOI) structure on a semiconductor substrate.

2. Related Art

A field-effect transistor formed on an SOI substrate has been drawing attention because of its usability in terms of easy element-isolation, no latch-up phenomenon, and small source/drain junction capacitance. Especially, since a fully depleted SOI transistor enabling low power consumption and high-speed operation is easy to be driven at low voltage, researches to drive an SOI transistor in a fully depleted mode are actively carried out. A method capable of manufacturing an SOI transistor economically by forming an SOI layer on a bulk substrate (i.e. Separation by Bonding Si islands (SBSI)) is disclosed in JP-A-2005-354024 and Separation by Bonding Si islands (SBSI) for LSI Application (T. Sakai et al.), Second International SiGe Technology and Device Meeting, Meeting Abstract, pp. 230-231, May (2004). In the SBSI, a Si layer and a SiGe layer are formed on a Si substrate, and only the SiGe layer is selectively removed by using etching rate difference between Si and SiGe so as to form a cavity between the Si substrate and the Si layer. Then the Si exposed in the cavity is thermally oxidized so as to fill between the Si substrate and the Si layer with a $SiO_2$ layer, thus forming a BOX layer between the Si substrate and the Si layer.

In the SBSI described above, the process to selectively remove the SiGe layer is important to obtain a stable yield on processes and a high yield of electric property. In a related art method, the yield on processes and the electric property are stable in a logic circuit and a memory circuit having an SOI layer of which a planar pattern has little size differences and little irregular denseness.

However, in a circuit mounting a bulk silicon device together with an SOI device, and in a circuit mounting devices employing different driving voltages, area difference and denseness difference are generally large between plane patterns of the SOI layer. Here, in a related art manufacturing method, an etching speed of the SiGe layer deteriorates in some areas due to the irregularity of the patterns (that is, the speed slows down). Especially, if the etching time is lengthened, an accelerated Si etching disadvantageously occurs. That is, in the manufacturing method in related art, in a case where a semiconductor device mounting various devices together such as a bulk silicon device and an SOI device is manufactured, an etching selectivity of a SiGe layer with respect to a Si layer partially deteriorates. Therefore, it is hard to form an SOI layer with a large area having a stable shape and an even film thickness or an SOI layer in various shapes with high yields.

In the process for etching the SiGe layer so as to form a cavity, extra etching time is required in order to prevent leaving a non-etching part of the SiGe layer. In the manufacturing method in related art, during the extra etching after the remove of the SiGe layer (that is, over-etching), an under surface of the Si layer (that is, the SOI layer) and an upper surface of the Si substrate facing the cavity get rough, disadvantageously producing irregularities thereon.

If the under surface of the SOI layer and the upper surface of the Si substrate get rough, the evenness of the film thickness of the SOI layer deteriorates. The thermal oxide film growing downward from the under surface of the SOI layer and the thermal oxide film growing upward from the upper surface of the Si substrate can not be contacted firmly at about the center in the thickness direction. Therefore, the adhesiveness of the SOI layer with respect to the Si substrate through the thermal oxide films (that is, the BOX layer) disadvantageously deteriorates. As the above, the manufacturing method in related art has been required to improve a process yield and stabilize electrical property of a semiconductor device mounting various devices together described above.

SUMMARY

An advantage of the present invention is to provide a method for manufacturing a semiconductor device capable of improving the process yield and stabilizing the electric property.

The inventors executed various experiments regarding selective etching of SiGe with hydrofluoric-nitric acid. From results of the experiments, the inventors found such selective etching mechanism that SiGe serves as an anode while Si serves as a cathode in the selective etching, and SiGe is removed by an electrochemical reaction such as the one shown in FIG. 18.

That is, the inventors consider that the "deterioration of the etching selectivity" is caused by decrease of oxidation number of SiGe or increase of oxidation number of Si due to insufficient supply of holes to a SiGe layer when SiGe is selectively etched.

The inventors also consider that the "roughness of the under surface of the SOI layer and the upper surface of the Si substrate" is caused by the following reason. In a case where the SiGe layer is present in the SiGe selective etching, holes transfer from the Si substrate to the SiGe layer. Thus the oxidation number of the SiGe layer increases, advancing the SiGe etching. On the other hand, since electrons are excessively present (that is, the oxidation number is small) in the Si layer and the Si substrate, Si is not etched. However, after the SiGe layer is removed, holes cannot transfer from Si to SiGe so as to increase the oxidation number of Si. Therefore holes transfer to the etchant as Si++, so that Si is etched. Namely, the under surface of the Si layer and the upper surface of the Si substrate serve as both of the anode and the cathode in a random manner so as to advance the etching of Si. Therefore, the under surface of the Si layer and the upper surface of the Si substrate get rough.

In particular, in the SiGe selective etching, after $HNO_3$ and HF molecules reach the surface of SiGe, the SiGe layer becomes a $H_2Si$ (or $Ge)F_6$ reaction product at the interface between the SiGe layer and the etchant so as to be removed. Here, when Si or Ge is denoted as IV (group), the removal reaction is shown as a formula 1.

$$IV + HNO_3 + 6HF \rightarrow H_2IVF_6 + HNO_2 + H_2O + H_2 \quad (1)$$

In this reaction, $HNO_3$ serves as an oxidizer so as to form an oxide IVO2 on the surface of the SiGe layer, while HF works to dissolve the oxide.

Here, in a case where SiGe and Si are layered on the Si substrate, as shown in FIG. 19, holes transfer from a wide gap (Si) to a narrow gap (SiGe) at the interface between SiGe and Si so as to accumulate at the narrow gap (SiGe) side. Thus chemical potentials (Fermi levels) of SiGe and Si agree with each other. Here, the gap indicates difference between an energy level Ec of a conduction band and an energy level Ev of a valence band, that is, a band gap Eg (=Ec−Ev). Further, i-Si in the figure is an intrinsic Si layer while i-SiGe is an intrinsic SiGe layer.

As shown in FIG. 19, at a contact interface between i-SiGe and i-Si, the difference ΔEv (up to 0.3V) between the energy levels of the both layers in the valence band is larger than the difference ΔEc (up to 0V) between those in the conduction band. Therefore, a positive charge easily transfers from the Si layer to the SiGe layer, so that the Fermi levels between the Si layer and the SiGe layer agree with each other. Accordingly, the SiGe layer has relatively more positive charges. Therefore, as shown in FIG. 18, the oxidation number of the SiGe layer is large at the interface between the SiGe layer and the etchant, and the SiGe layer electrically behaves as an anode electrode, supplying holes to the etchant (hereinafter, also referred to as "solution") in $IV^{++}$ as shown by formulae 2 through 4. Further, if the Si substrate is made in P-type, transference of the holes from Si to SiGe is further increased, enhancing the oxidation number of the SiGe layer.

$$IV + 2h^+ \rightarrow IV^{++} \quad (2)$$

$$IV^{++} + 2OH^- \rightarrow IVO_2 + H_2 \quad (3)$$

$$IVO_2 + 6HF \rightarrow H_2IVF_6 + 2H_2O \quad (4)$$

On the other hand, the number of negative charges is relatively large in the Si layer. At the interface between the Si layer and the solution, the Si layer behaves as a cathode electrode, supplying electrons to the solution in $NO^{2-}$ as shown by the formulae 5 and 6.

$$Si + 2e \rightarrow Si^- \quad (5)$$

$$Si^- + 2NO_2 \rightarrow Si(solid) + 2NO^{2-}(liquid) \quad (6)$$

Therefore, when the SiGe layer is selectively etched, as shown in FIG. 18, the SiGe layer serves as an anode while the Si layer serves as a cathode, making electric current (the hole h+) circulate in the order of the etchant, the Si layer, and the SiGe layer, and repeat this circulation. Accordingly, to improve the etching selectivity for selectively etching the SiGe layer, following a) and b) are important.

a) Increasing the oxidation number (the number of excessive holes) of the SiGe layer b) Supplying $Si^{++}$ holes, which correspond to those taken out to the solution in response to etching, to the SiGe layer from the Si layer and the Si substrate Further, in a multilayer structure composed of a Si layer, a SiGe layer (a Ge concentration of 37%, and a thickness of 30 nm), and a Si substrate, the etching rate of the SiGe layer exceeds 0.01 μm/second. Namely, the current flowing per unit area at the interface between the SiGe layer and the solution reaches several tens of mA/cm². Therefore, to ensure a high etching speed and high selectivity of the SiGe layer, a route shown above (that is, the circle of the etchant, the Si layer, and the SiGe layer) requires a path for a large current circulating, whereby following c) and d) are important.

c) Securing an electric current path at the interfaces between the Si layer and the solution and between the Si substrate and the solution d) Securing an electric current path at the interface between the Si layer and the SiGe layer Since the electric current (holes) cannot be supplied from Si to SiGe after the SiGe layer is removed, the number of the holes in the Si layer and the Si substrate increases. Therefore, in the interfaces between the Si layer and the solution and between the Si substrate and the solution, functions of both of the anode and the cathode become available in a random manner, advancing the oxidation and the etching in the Si layer and the Si substrate as well. In order to restrain the etching of the Si layer and the Si substrate, it is important to increase the number of excessive electrons and decrease the oxidation number in the Si layer. The present invention is based on such information.

A method for manufacturing a semiconductor device according to a first aspect of the invention, includes: (a) forming a SiGe layer on a Si substrate; (b) forming a Si layer on the SiGe layer; (c) forming a dummy pattern made of SiGe in a dummy region of the Si substrate; and (d) wet-etching and removing the SiGe layer formed under the Si layer. In the step (d), an etchant is kept to contact the dummy pattern from before a complete remove of the SiGe layer to an end of the etching. Here, the dummy region is a region for forming a dummy pattern made of SiGe (or the SiGe layer).

In the method of the first aspect, the etchant may be kept to contact the dummy pattern from a beginning of the etching to an end of the etching in the step (d).

According to the first aspect, even after the SiGe layer is removed by wet-etching, the dummy pattern is kept to be etched by the etchant. Therefore, even in a case where the SiGe layer in the element region is over-etched, electric current (hole h+) required for etching the SiGe layer can circulate in the order of the etchant, the Si substrate (or the Si layer), and the SiGe layer (dummy pattern), and repeat this circulation. Thus the oxidation number of Si can be maintained low from the beginning to the end of the wet-etching.

A method for manufacturing a semiconductor device according to a second embodiment of the invention, includes: (e) forming a SiGe layer on a Si substrate; (f) forming a Si layer on the SiGe layer; (g) etching the Si layer and the SiGe layer partially so as to form a dummy pattern made of the SiGe layer in a dummy region of the Si substrate and form a groove exposing a lateral surface of the dummy pattern and a lateral surface of the SiGe layer in an element region; and (h) wet-etching the SiGe layer through the groove so as to form a cavity between the Si substrate and the Si layer in the element region. In the step (h), an etchant is kept to contact the dummy pattern through the groove from a beginning of the etching to an end of the etching.

In the method of the second aspect, the element region may be a region for forming an SOI device; a region for forming a bulk silicon device, an element isolation region, a region for forming a scrub line may be prepared as well as the region for forming the SOI device on the Si substrate; and the dummy region may be prepared in at least one of the region for forming the SOI device, the region for forming the bulk silicon device, the element isolation region, and the region for forming the scrub line.

Here, the "SOI device" indicates an electronic device to be formed on the Si layer (that is, an SOI layer) formed on an insulating film. In addition, the "bulk silicon device" indicates an electronic device to be formed on a bulk Si substrate. In embodiments of the present invention, a region on which the SOI device is to be formed is called as an "SOI region", and a region on which the bulk silicon device is to be formed is called as a "bulk region".

In the method of the second aspect, the dummy pattern may be formed such that a part of the dummy pattern is left on the Si substrate in the dummy region even after the SiGe layer is completely removed from the element region of the Si substrate in the step (g).

The method of the second aspect, further includes: forming an insulating film in the cavity so as to fill the cavity; and etching and removing the dummy pattern after the insulating film is formed. Here, the "insulating film" indicates a BOX layer included to the SOI structure, and made by thermal oxidization or CVD, for example.

In the method of the aspects, the etchant may be made of a mixed solution including one of HF and $NH_4F$; $HNO_3$; and $H_2O$.

In the method of the aspects, the etchant may be made of a mixed solution including $CH_3COOH$; one of HF and $NH_4F$; $HNO_3$; and $H_2O$.

According to the second aspect, in the step (h), even after the SiGe layer is completely removed from the element region of the Si substrate, electric current (hole $h^+$) can circulate in the order of the etchant, the Si substrate (or the Si layer), and the dummy pattern, and repeat this circulation. Thus the circulation, which is required for lowering the oxidation number of Si, of the electric current (hole $h^+$) from Si to SiGe can be performed. That is, in the step (h), a large current path through which the current circulates in the order of etchant, Si, SiGe, and the etchant can be secured.

Therefore, irrespective of the denseness and the size of the pattern of the Si layer (that is, the SOI layer) in the element region, the oxidation numbers of the Si substrate and the Si layer can be kept to be low, being able to prevent deterioration of the etching selectivity of SiGe with respect to Si. Further, irrespective of the denseness and the size of the pattern of the SOI layer, the roughness caused by the etching (that is, a generation of irregularities) of the upper surface of the Si substrate and the under surface of the Si layer facing the cavity can be restrained so as to enhance the adhesiveness of the SOI layer to the Si substrate through the BOX layer.

Accordingly, the process yield can be improved and the electric property is stabilized on a semiconductor device mounting various devices together such as a circuit mounting the bulk silicon device and an SOI device, and a circuit mounting devices employing different driving voltages.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will be described below with reference to the accompanying drawings.

First Embodiment

FIGS. 1A through 8B are diagrams showing a method for manufacturing a semiconductor device according to a first embodiment of the invention. In FIGS. 1A through 8B, figures suffixed with the letter "A" are plan views. Figures suffixed with the letter "B" are sectional view respectively taken along the lines A1-A1' to A8-A'8 of the figures suffixed with the letter "A". Further, in FIGS. 4A to 6C, FIGS. 4C, 5C, and 6C are sectional views respectively taken along the lines B4-B'4, B5-B5', and B6-B'6. In FIGS. 5A to 6D, FIG. 5D and FIG. 6D are sectional views respectively taken along the line C5-C'5 and C6-C'6.

Figure 1A:
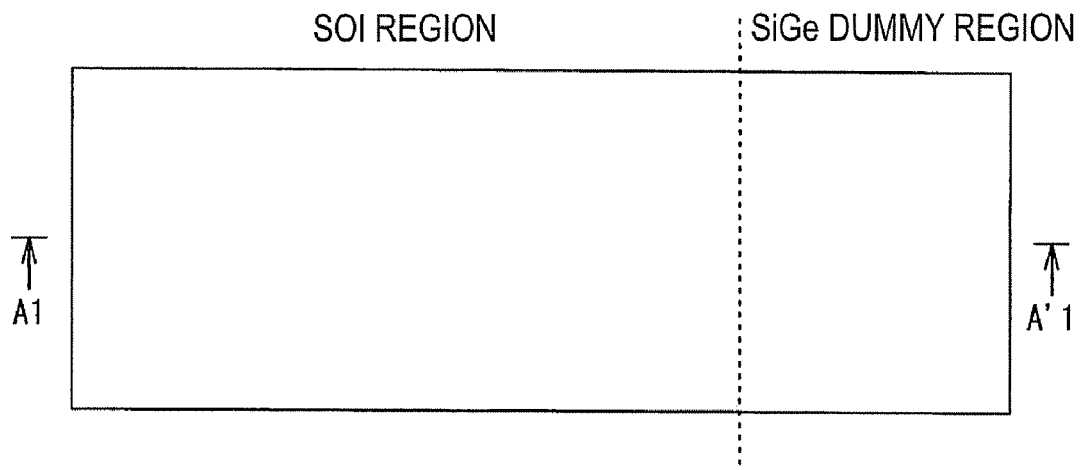
FIGS. 1A and 1B are diagrams showing a method for manufacturing a semiconductor device according to a first embodiment (first step).
Figure 1B:
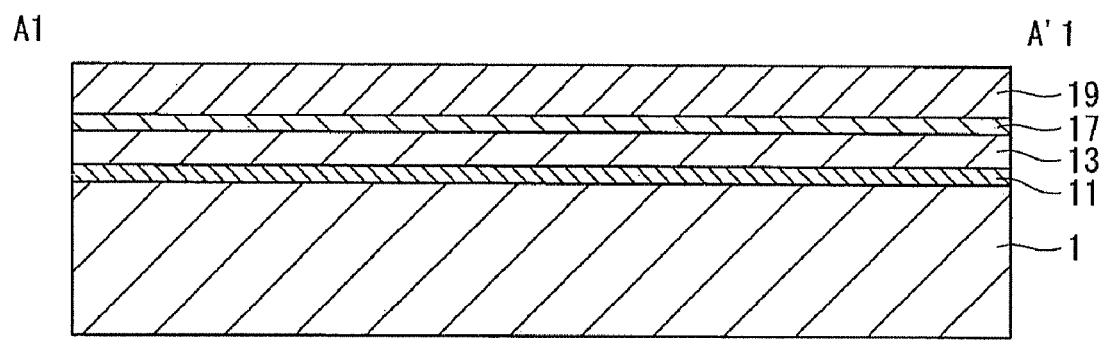

Referring to FIGS. 1A and 1B, on a whole surface of a Si substrate 1 including an SOI region and a SiGe dummy region, a single-crystalline silicon buffer (Si-buffer) layer which is not shown, a single-crystalline silicon-germanium (SiGe) layer 11, and a single-crystalline silicon (Si) layer 13 are layered in this order. The Si-buffer layer, the SiGe layer 11, and the Si layer 13 are sequentially formed by epitaxial growth, for example. Here, the SOI region is for forming an SOI device, and the SiGe dummy region is for forming a dummy pattern made of SiGe.

Figure 2A:
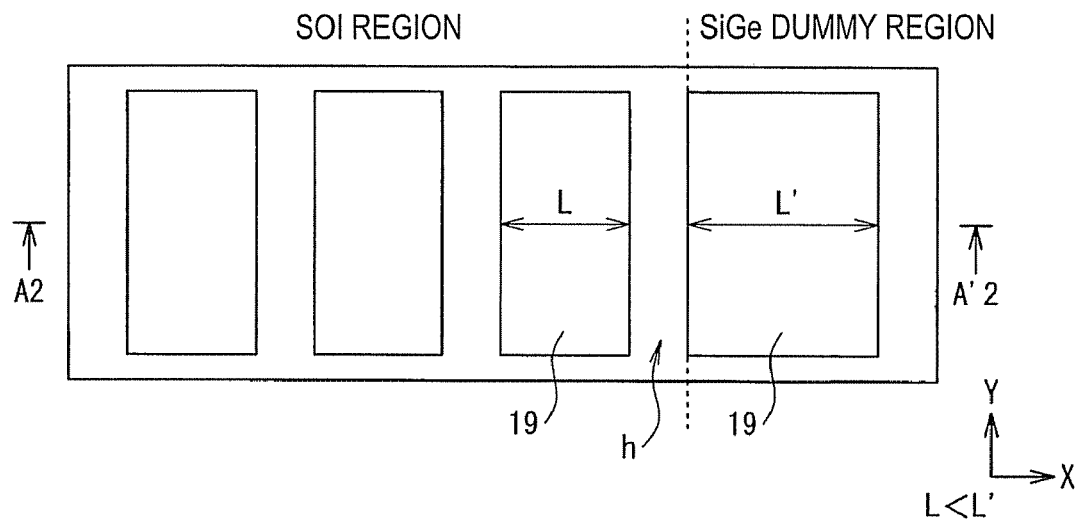
FIGS. 2A and 2B are diagrams showing the method for manufacturing a semiconductor device according to the first embodiment (second step).
Figure 2B:
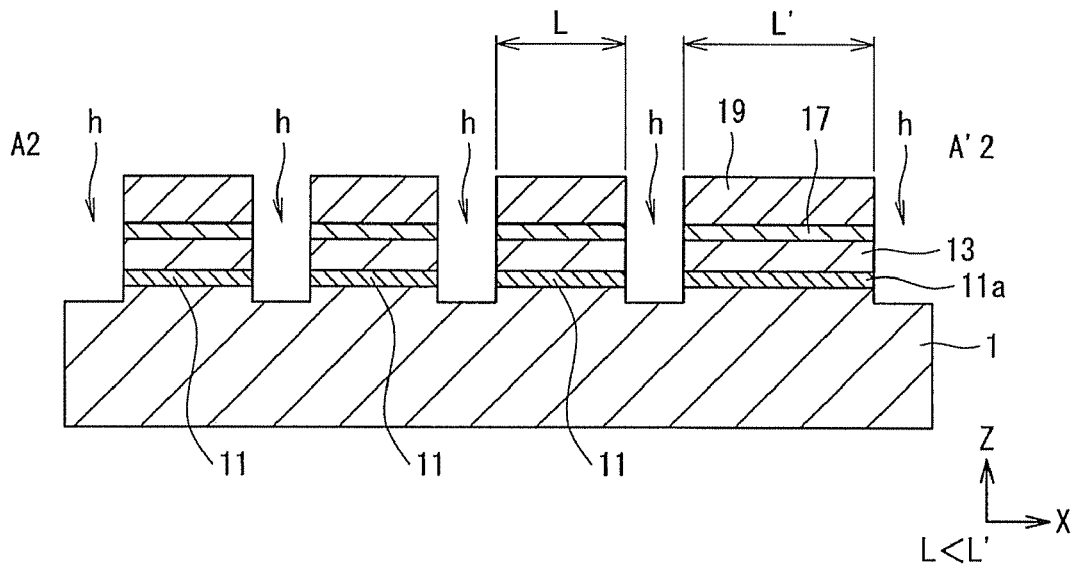

Then, over the whole upper surface of the Si substrate 1, a $SiO_2$ film 17 and a silicon nitride ($Si_3N_4$) film 19 are layered in this order. The $SiO_2$ film 17 and the $Si_3N_4$ film 19 are formed by CVD, for example. Then the $Si_3N_4$ film 19, the $SiO_2$ film 17, the Si layer 13, the SiGe layer 11, and the Si-buffer layer (not shown) are etched partially by photolithography and etching, as shown in FIGS. 2A and 2B. Thus a depressed portion h for element isolation is formed at a region that is overlapped with an element isolation region (that is, a region where an SOI structure is not formed) when viewed from above. Part of the depressed portion h (part for arranging a leg part of a support) becomes a recess for the support in SBSI. In this etching process, the etching may be performed until reaching the surface of the Si substrate 1, or the substrate 1 may be overetched to form a concave thereon.

This etching forms a dummy pattern (that is, a SiGe dummy pattern) 11a on the SiGe dummy region of the Si substrate. As shown in FIGS. 2A and 2B, a width L' of the SiGe dummy pattern 11a is formed to be longer than a length L along X-axis direction (that is, a width) of the SiGe layer 11 that is left in the SOI region. This is for keeping a part of the GiGe dummy pattern until the end of etching in a SiGe selective etching process described later.

A specific value of the width L' of the SiGe dummy pattern 11a is set as, for example, the following method in the planning phase. In the first embodiment, the upper surfaces of the SiGe layer 11 in the SOI region and the SiGe dummy pattern 11a are covered by the Si layer 13, and lateral surfaces of SiGe are subject to SiGe selective-etching in an exposed manner from a groove H (refer to FIGS. 5A to 5C, for example). Therefore, such an experiment (or a simulation) is executed that the whole upper surface of SiGe is covered by Si at first and the SiGe is wet-etched in a state the lateral surfaces are exposed to the groove H. Next, an etching amount from the lateral surfaces of the SiGe (that is, along X-axis direction) is measured. After that, the shape and the size of the SiGe dummy pattern is adjusted such that the width of the SiGe dummy pattern is larger than the etching amount along X-axis direction. That is, the shape and the width L' is set so as to leave a part of the SiGe dummy pattern 11a even after the SiGe layer 11 is completely removed by wet-etching. If the shape and the size of the SiGe dummy pattern 11a is set in such procedure, the SiGe dummy pattern 11a can be maintained until the end of the etching in the SiGe selective etching process described later, thus being able to keep the lateral surfaces of the SiGe to contact an etchant.

Figure 3A:
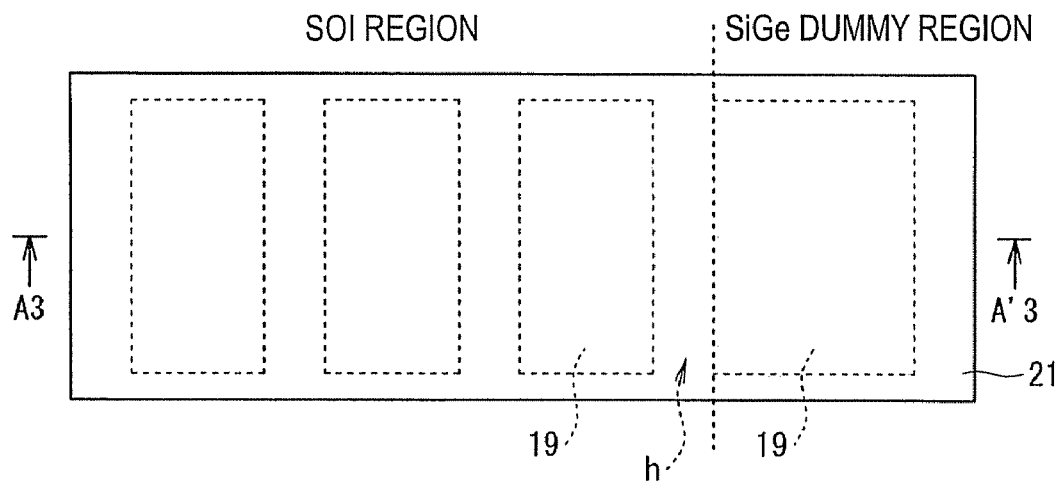
FIGS. 3A and 3B are diagrams showing the method for manufacturing a semiconductor device according to the first embodiment (third step).
Figure 3B:
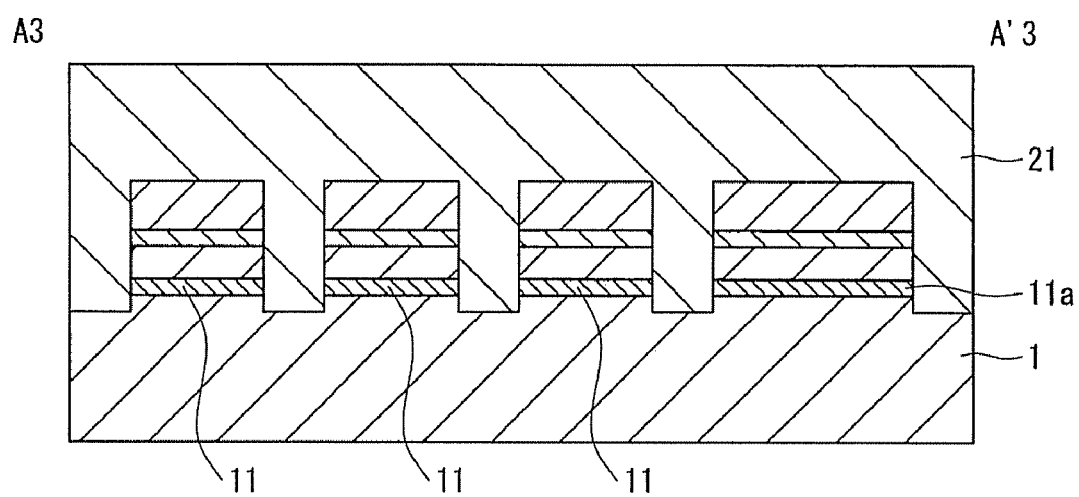
Figure 4A:
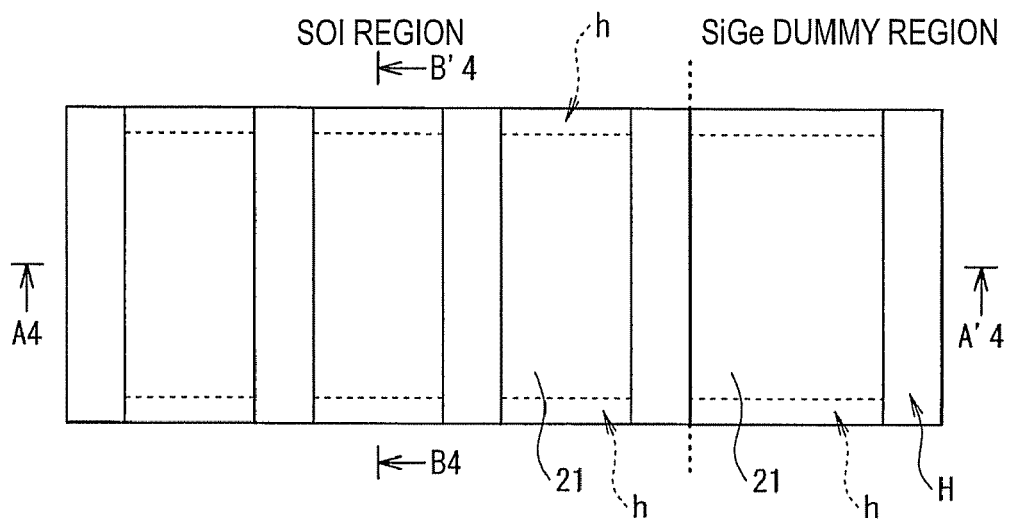
FIGS. 4A to 4C are diagrams showing the method for manufacturing a semiconductor device according to the first embodiment (fourth step).
Figure 4B:
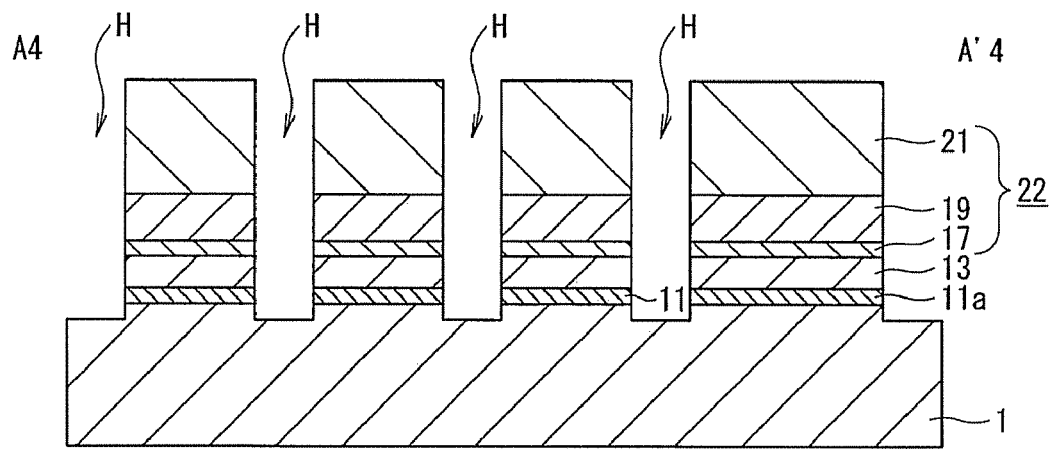
Figure 4C:
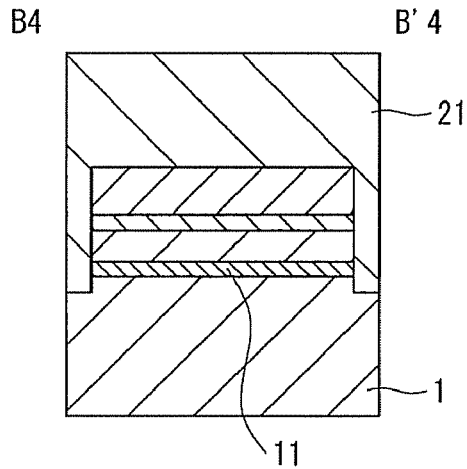

Next, as shown in FIGS. 3A and 3B, a $SiO_2$ film 21 is formed on the whole surface of the Si substrate 1 in a manner filling the depressed portion h. The $SiO_2$ film 21 is formed by CVD, for example. Referring now to FIGS. 4A to 4C, the $SiO_2$ film 21 is partially etched by photolithography and etching so as to form a support 22 composed of the $SiO_2$ film 21, the $Si_3N_4$ film 19, and the $SiO_2$ film 17 while forming a groove H to expose the surface of the Si substrate 1. Here, the groove H in the SOI region and the SiGe dummy region serves as an inlet of an etchant when the SiGe layer 11 is etched in a process later.

In the process for etching the $SiO_2$ film 21, the $Si_3N_4$ film 19 functions as a mask. In the first embodiment, the $SiO_2$ film 21 is removed by etching at a part of the depressed portion h that has already formed. Thus the part of the depressed portion h becomes the groove H. Therefore, in a region where the depressed portion h and the groove H are overlapped when viewed from above, the groove H is self-alignmently formed due to the presence of the $Si_3N_4$ film 19. Thus, a size of the groove H is defined only by a processing dimension of the depressed portion h.

Therefore, in FIGS. 4A to 4C, even though a photo-mask (not shown) that is set on a stepper, for example, and the Si substrate 1 are positioned with some tolerance to form a resist pattern (not shown) out of alignment in some degree with respect to the Si substrate 1, the groove H can be formed with positional accuracy. Since the $Si_3N_4$ film 19 functions as a mask, the groove H can be accurately formed even in a case where the $SiO_2$ film 21 is etched with the use of a resist pattern R of which a mask region is smaller than the SiGe dummy pattern 11a.

In the process for forming the groove H, the etching may be performed until reaching the surface of the Si substrate 1, or the substrate 1 may be overetched to form a concave thereon.

Then an etchant such as a hydrofluoric-nitric acid solution is brought into contact with lateral surfaces of the Si layer 13 and the SiGe layer 11 through the groove H so as to selectively remove the SiGe layer 11, in FIGS. 4A to 4C. The hydrofluoric-nitric acid solution is a mixed solution including HF (or $NH_4F$), $HNO_3$, and $H_2O$.

Figure 5A:
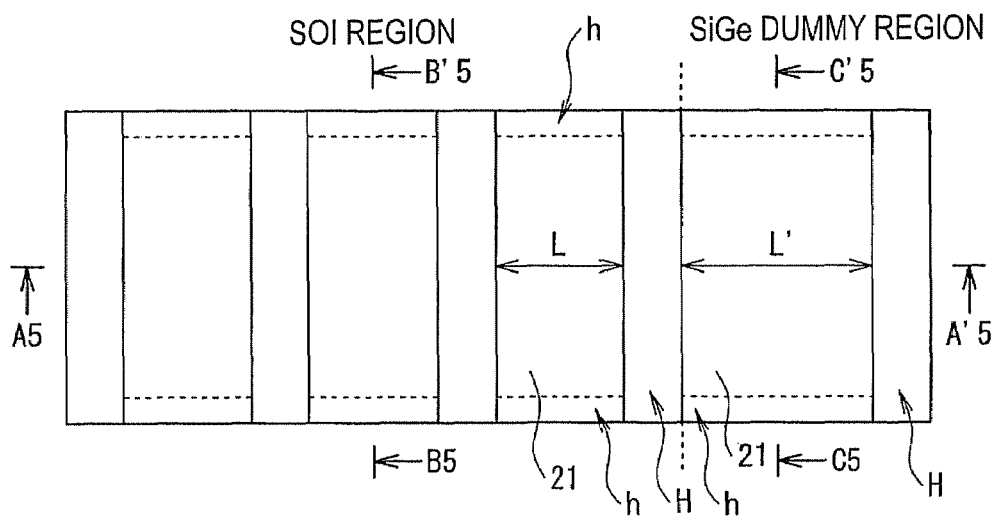
FIGS. 5A to 5D are diagrams showing the method for manufacturing a semiconductor device according to the first embodiment (fifth step).
Figure 5B:
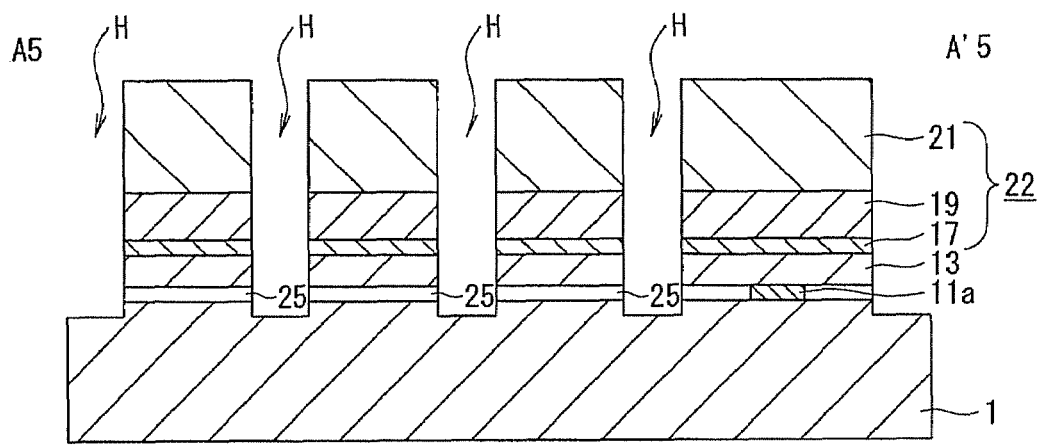
Figures 5C, 5D:
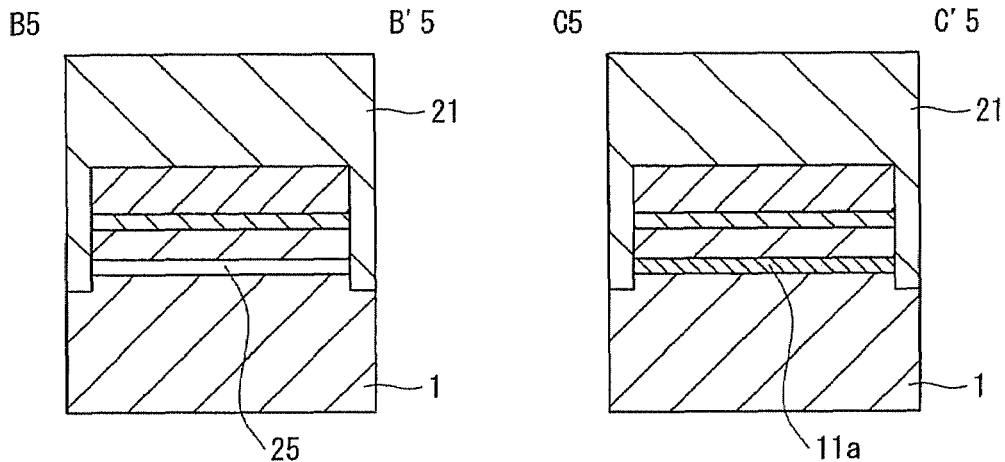
Figure 6A:
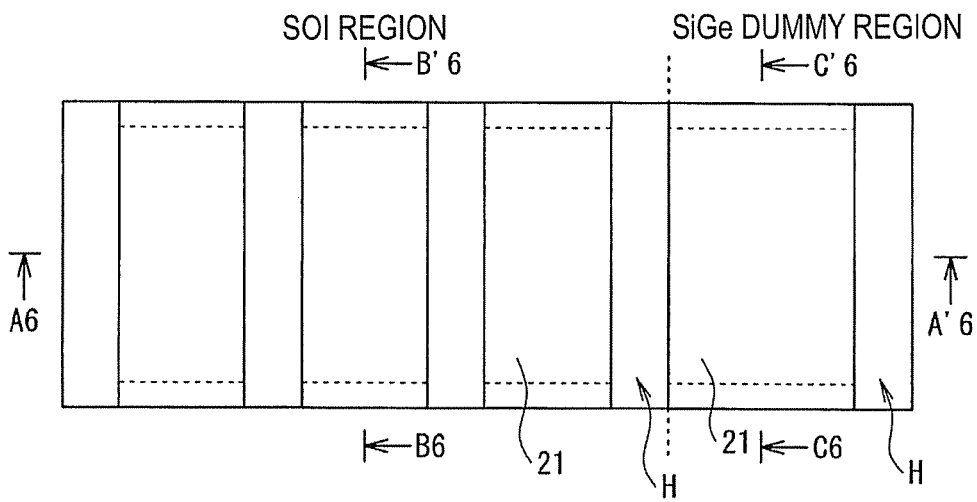
FIGS. 6A to 6D are diagrams showing the method for manufacturing a semiconductor device according to the first embodiment (sixth step).
Figure 6B:
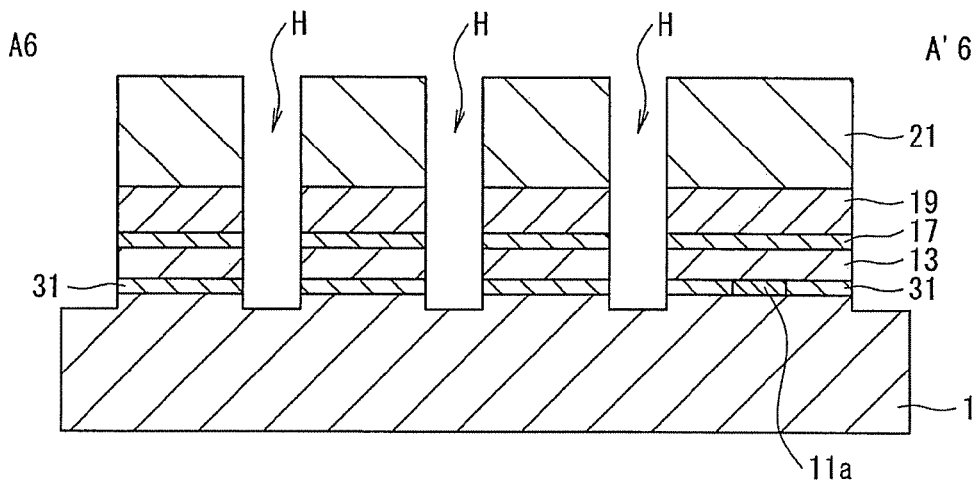
Figures 6C, 6D:
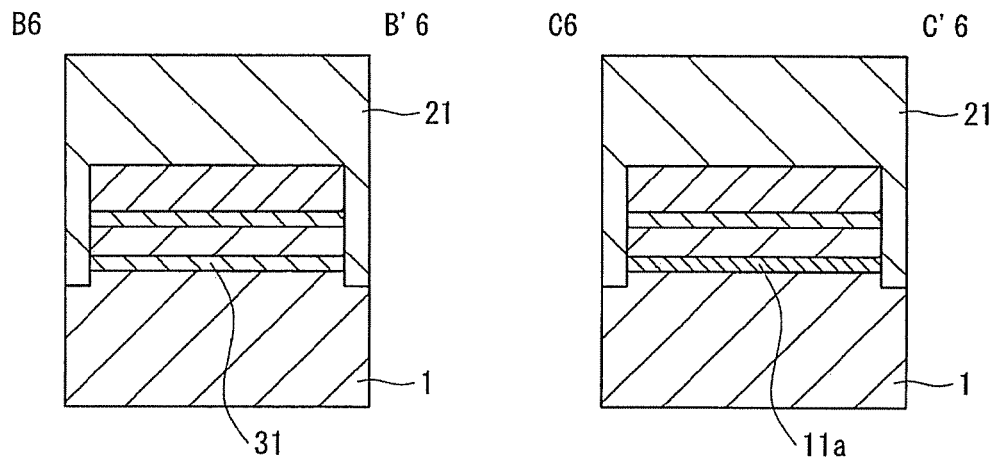

Accordingly, a cavity 25 is formed between the Si layer 13 the Si substrate 1 as shown in FIGS. 5B and 5C. In wet-etching using the hydrofluoric-nitric acid solution, since an etching rate of SiGe is higher than that of Si, (that is, an etching selectivity of SiGe with respect to Si is high), only the SiGe layer 11 can be etched to be removed while leaving the Si layer 13. After the cavity 25 is formed, the upper surface and the lateral surface of the Si layer 13 are supported by the support 22.

In the first embodiment, in the etching process of the SiGe layer 11 (that is, in the SiGe selective etching process), the whole upper surface of the SiGe dummy pattern 11a is covered by the Si layer 13, and the lateral surfaces thereof are exposed to the groove H. Therefore, in the SiGe selective etching process, the lateral surfaces of the SiGe dummy pattern 11a are also etched from the lateral sides. The SiGe dummy pattern 11a is formed large enough that part of the SiGe dummy pattern 11a remains even after the SiGe layer 11 is completely removed by wet-etching, so that the lateral surfaces of the SiGe dummy pattern 11a can be kept to contact the etchant.

Figure 18:
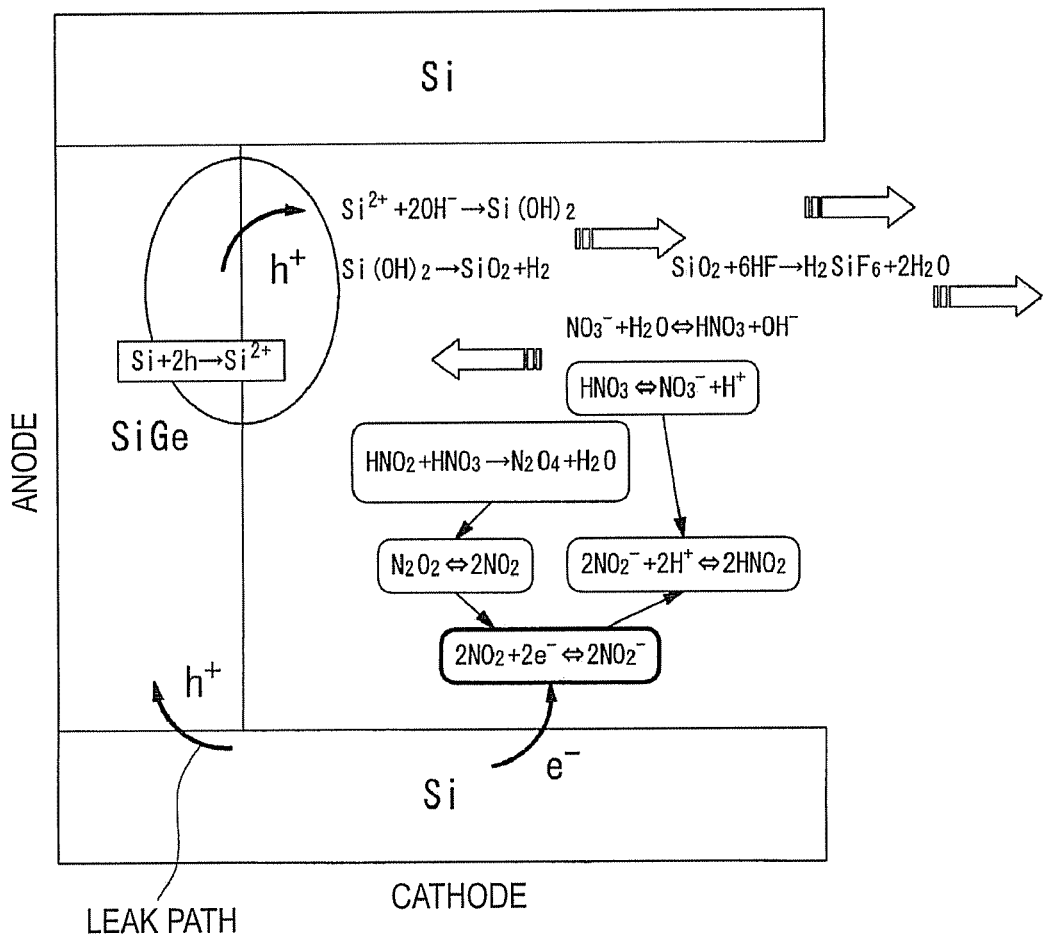
FIG. 18 is a diagram showing an etching mechanism, found by the inventors, of a SiGe layer.
Figure 19:
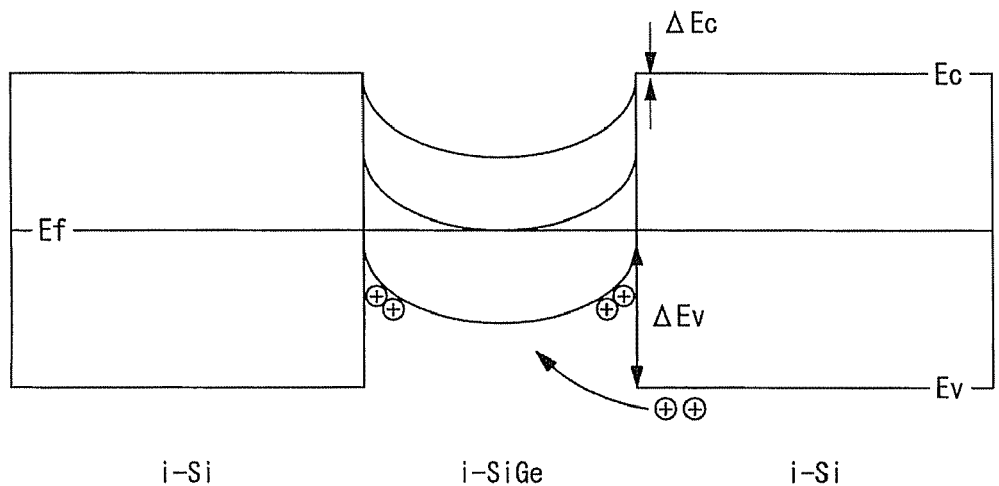
FIG. 19 is a diagram showing difference between energy levels of i-SiGe and i-Si.

Therefore, in the SiGe selective etching process shown in FIGS. 5A to 5D, electric current (hole $h^+$) required for the SiGe etching can circulate in the order of the etchant, the Si substrate 1 (or the Si-buffer layer), and the SiGe layer 11 (or the SiGe dummy pattern 11a) and repeat this circulation, as shown in FIG. 18. Therefore, the oxidation number of the Si substrate 1 and the Si layer 13 can be kept low not only before the complete remove of the SiGe layer 11 but also after the remove.

Figure 7A:
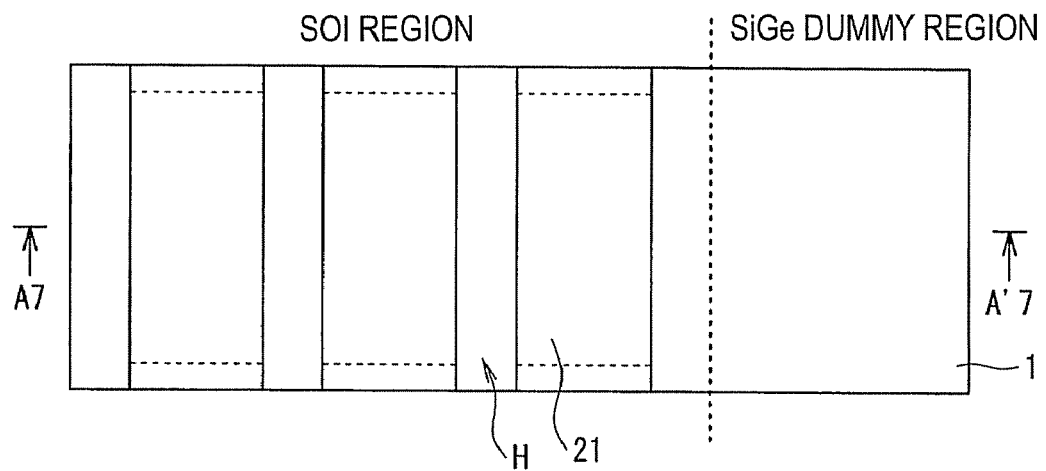
FIGS. 7A and 7B are diagrams showing the method for manufacturing a semiconductor device according to the first embodiment (seventh step).
Figure 7B:
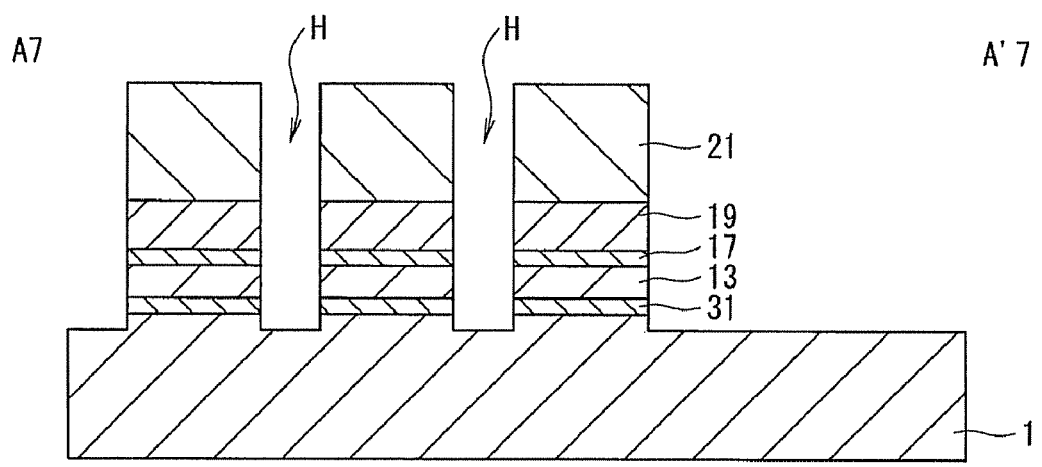

As shown in FIGS. 6A to 6D, the upper surface of the Si substrate 1 and the under surface of the Si layer 13 are thermally oxidized so as to form a $SiO_2$ film (that is, a BOX layer) 31 in the cavity. After the cavity is filled with the $SiO_2$ film 31, the SiGe dummy pattern that is left in the SiGe dummy region is removed by photolithography and etching, as shown in FIGS. 7A and 7B. In the first embodiment, when the SiGe dummy pattern is removed, the $SiO_2$ film 21, the $Si_3N_4$ film 19, the $SiO_2$ film 17, the Si layer 13, and the $SiO_2$ film 31 that are left in the SiGe dummy region are also removed.

Figure 8A:
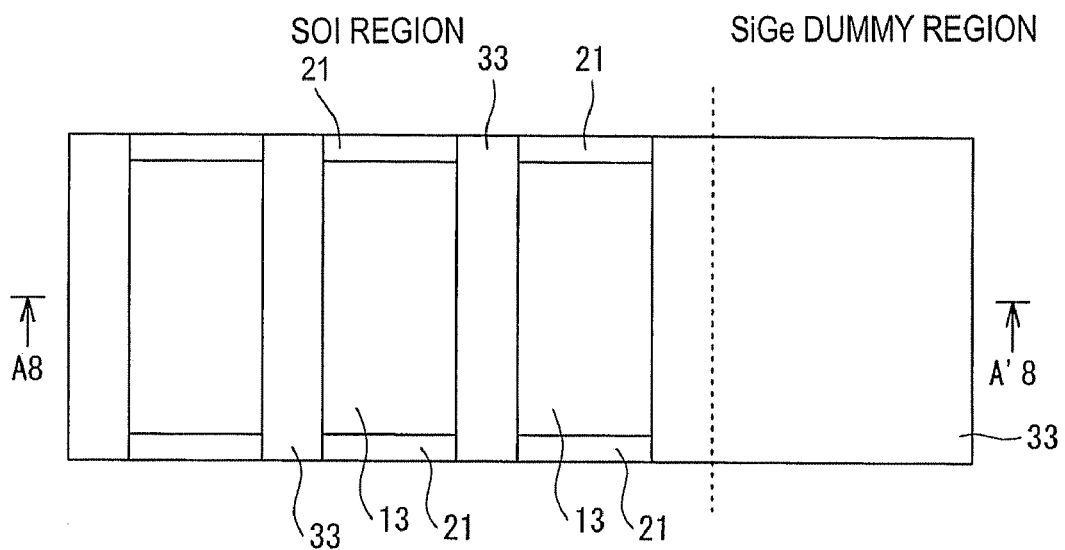
FIGS. 8A and 8B are diagrams showing the method for manufacturing a semiconductor device according to the first embodiment (eighth step).
Figure 8B:
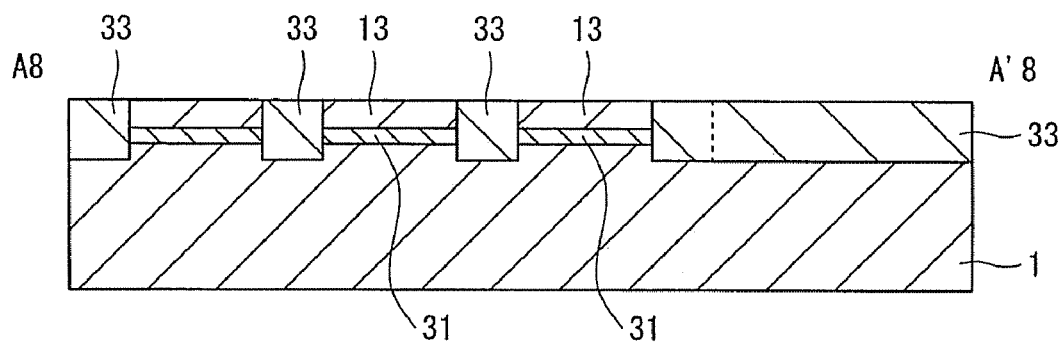
Figure 9A:
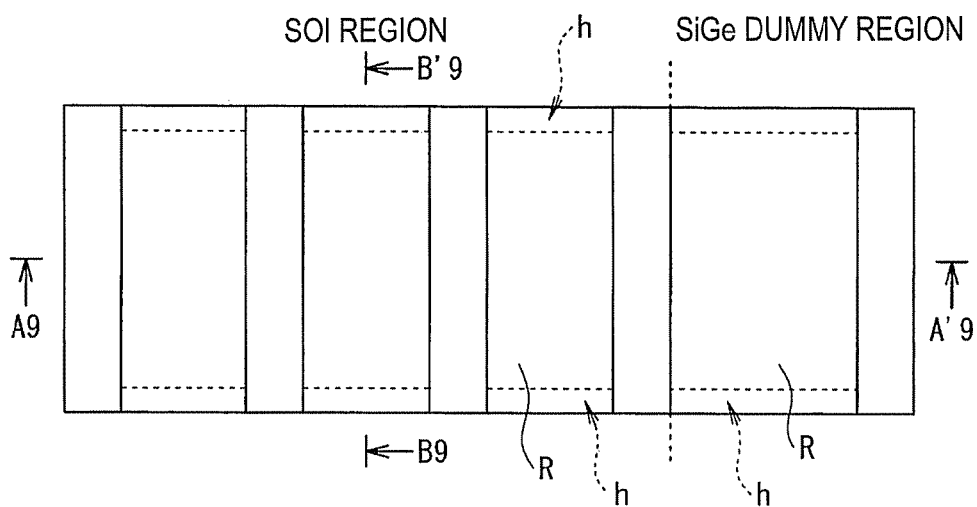
FIGS. 9A to 9C are diagrams showing another method for manufacturing a semiconductor device according to the first embodiment (first step).
Figure 9B:
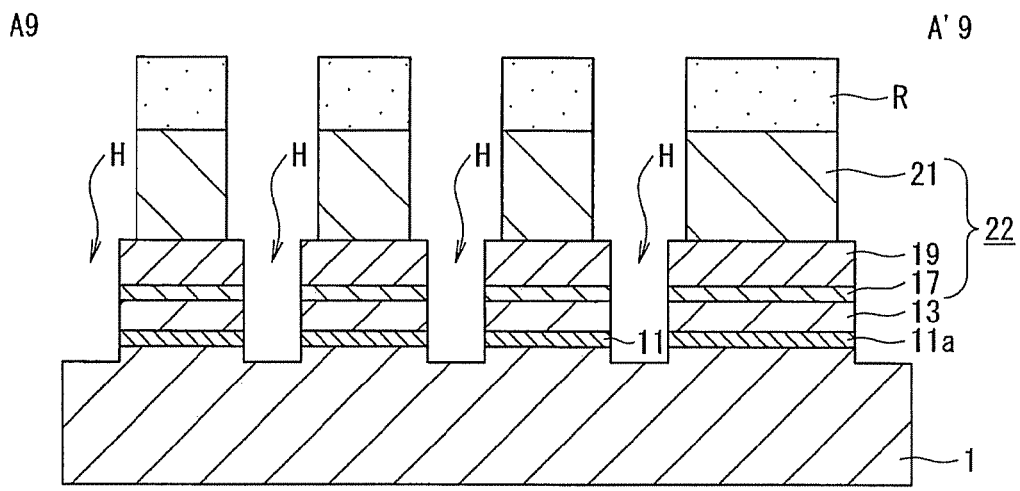
Figure 9C:
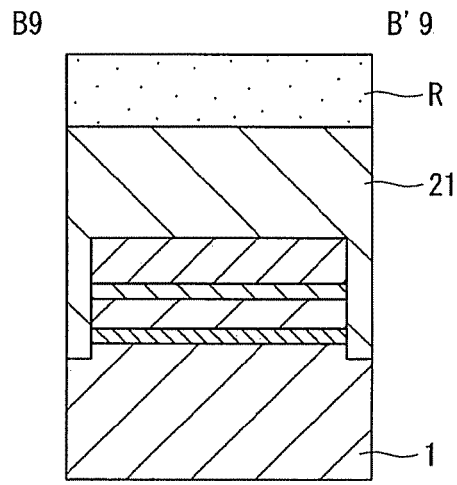

As shown in FIGS. 8A and 8B, an insulating film 33 is formed on the whole surface of the Si substrate 1 in a manner filling the groove H and covering the SiGe dummy region of the Si substrate 1 by CVD, for example. The insulating film 33 is, for example, a $SiO_2$ film or a silicon nitride ($Si_3N_4$) film. Then the insulating film 33 and the $SiO_2$ film 21 that is formed under the insulating film 33 are planarized by CMP, for example. Further, the $Si_3N_4$ film 19 is wet-etched with, for example, hot phosphoric acid (refer to FIGS. 7A and 7B). Subsequently, the $SiO_2$ film 17 is wet-etched with, for example, diluted hydrofluoric acid solution (refer to FIGS. 7A and 7B).

Thus the insulating film 33 and the like are completely removed from the upper surface of the Si layer 13, completing the SOI structure composed of the $SiO_2$ film 31 and the Si layer 13 on the SOI region of the Si substrate 1. The insulating film 33 covering the upper surface of the Si substrate 1 in its dummy region functions as an element insulation layer, in the same manner as the insulating film 33 filling the groove H in the SOI region and the $SiO_2$ film 21 filling the depressed portion h. After the SOI structure is formed on the Si substrate 1, an SOI device is formed on the Si layer 13 in the SOI region, for example.

Figure 10A:
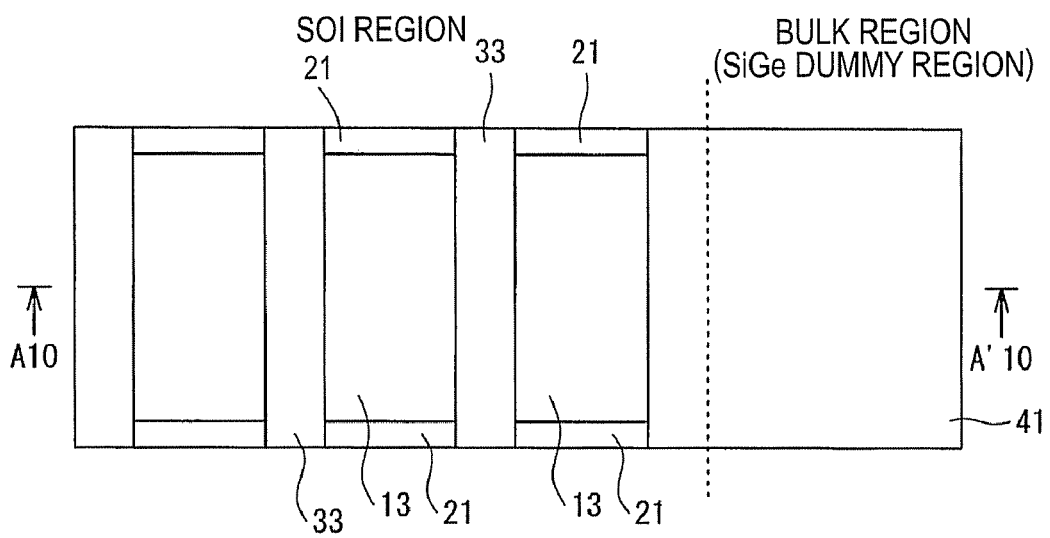
FIGS. 10A and 10B are diagrams showing another method for manufacturing a semiconductor device according to the first embodiment (second step).
Figure 10B:
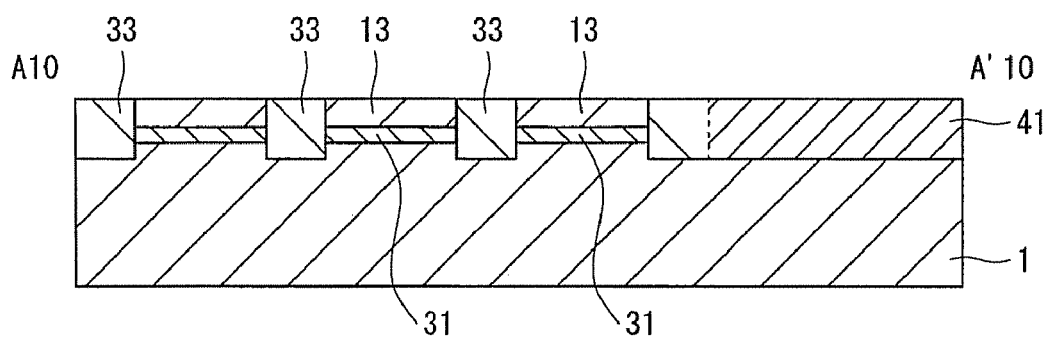

Here, FIGS. 8A and 8B show a state that the whole of the SiGe dummy region is covered by the insulating film 33, but this is an example. For example, a Si layer 41 may be formed by selective epitaxial growth on the SiGe dummy region of the Si bustrate 1 so as to form a device on the Si layer 41, in the embodiment, as shown in FIGS. 10a and 10B. That is, after the SiGe selective etching, the Si layer 41 is directly formed on the SiGe dummy region of the Si substrate 1 so as to change the SiGe dummy region into a bulk region. In such method, a bulk silicon device can be formed in the SiGe dummy region, thus being able to provide a circuit mounting a bulk silicon device together with an SOI device on one substrate.

According to the method for manufacturing a semiconductor device of the first embodiment, electric current (hole $h^+$) can circulate in the order of the etchant, the Si substrate 1 (or the Si layer 13), and the dummy pattern 11a and repeat this circulation, after the SiGe layer 11 is completely removed as well, in the SiGe selective etching process. Thus the current (hole $h^+$) circulation from Si to SiGe required for decreasing the oxidation number of Si can be performed from the beginning to the end of the wet-etching. That is, a large current path through which the current circulates in the order of etchant, Si, SiGe, and the etchant can be secured in the SiGe selective etching process.

Thus, the oxidation numbers of the Si substrate 1 and the Si layer 13 can be kept low irrespective of the denseness and the size of the pattern of the Si layer (that is, the SOI layer) 13 in the SOI region. Therefore, the etching selectivity of SiGe with respect to Si can be prevented from deteriorating, and roughness on the upper surface of the Si substrate 1 and the under surface of the SOI layer facing the cavity 25 (that is, occurrence of irregularity) can be restrained. Accordingly, adhesiveness of the SOI layer 13 with respect to the Si substrate 1 through the BOX layer 31 can be improved, being able to improve the process yield of the semiconductor device mounting various devices, such as a circuit mounting the bulk silicon device together with the SOI device and a circuit mounting devices employing different driving voltages, and stabilize the electric property.

Second Embodiment

While the first embodiment shows the case where one SOI region and one SiGe dummy region are arranged in an adjacent manner, the positional relation between them is not limited to such case. In order to maintain a SiGe dummy pattern as long as possible in a SiGe selective etching process, the positional relation between the SOI region and the SiGe dummy region may be devised as well as the shape or the size of the SiGe dummy pattern.

FIGS. 11 to 16 are plan views showing a method for manufacturing a semiconductor device according to a second embodiment of the invention. In the second embodiment, members having the same structure and the function as those in the first embodiment have the same reference numerals and their description will be omitted.

Figure 11:
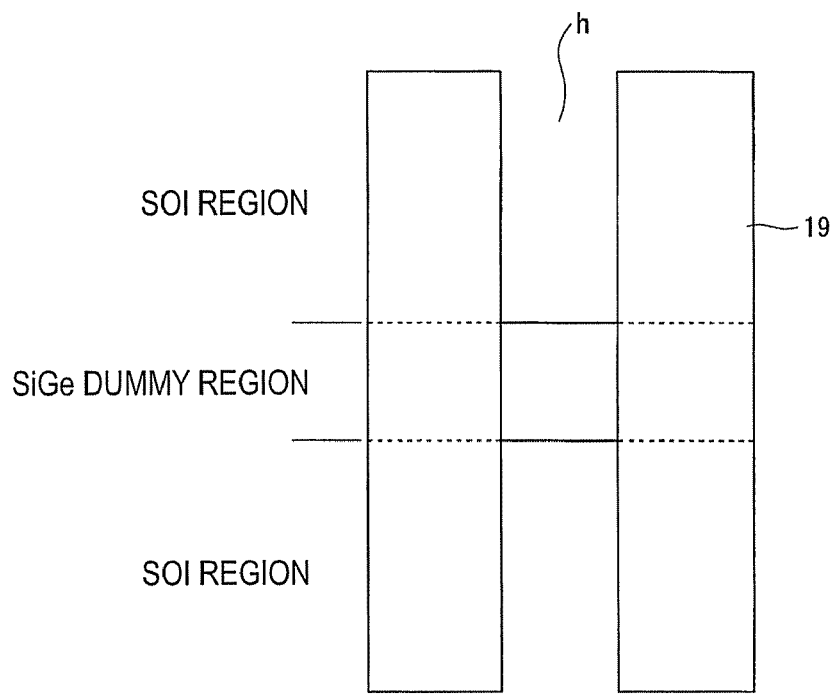
FIG. 11 is a diagram showing a method for manufacturing a semiconductor device according to a second embodiment (first step).

Referring to FIG. 11, a single crystalline Si-buffer layer which is not shown, a single crystalline SiGe layer, and a single crystalline Si layer are layered on the whole upper surface of a Si substrate including an SOI region and a SiGe dummy region. The Si-buffer layer, the SiGe layer, and the Si layer are sequentially formed by epitaxial growth, for example. Then, above the whole surface of the Si substrate, a $SiO_2$ film which is not shown and the $Si_3N_4$ film 19 are formed in sequence. Then the $Si_3N_4$ film 19, the $SiO_2$ film, the Si layer, the SiGe layer, and the Si-buffer layer (not shown) are partially etched so as to form a depressed portion h for element isolation. Part of the depressed portion h is to be a recess for a support in the SBSI method. Due to the forming of the depressed portion h, the $Si_3N_4$ film, the $SiO_2$ film, the Si layer, the SiGe layer, and the Si-buffer layer are left only in the SOI region and the SiGe dummy region, being removed in other part.

Figure 12:
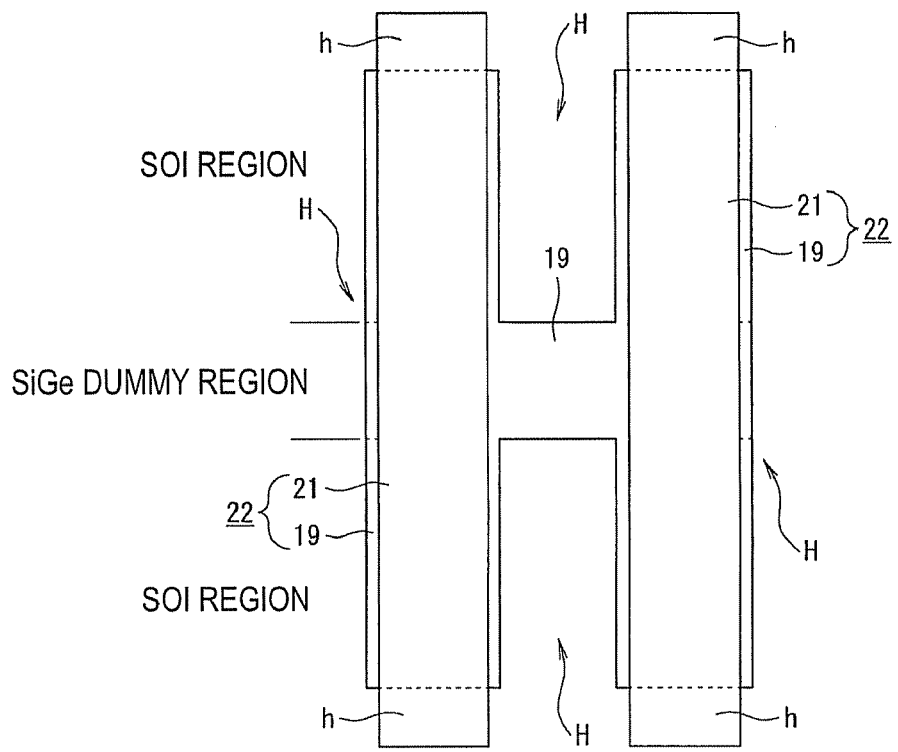
FIG. 12 is a diagram showing the method for manufacturing a semiconductor device according to the second embodiment (second step).

Next, a $SiO_2$ film 21 is formed on the whole surface of the Si substrate in a manner filling the depressed portion h. The $SiO_2$ film 21 is formed by CVD, for example. As shown in FIG. 12, the $SiO_2$ film 21 is partially etched by photolithography and etching so as to form the support 22 composed of the $SiO_2$ film 21, the $Si_3N_4$ film 19, and the $SiO_2$ film while forming the groove H to expose the surface of the Si substrate 1.

Figure 13:
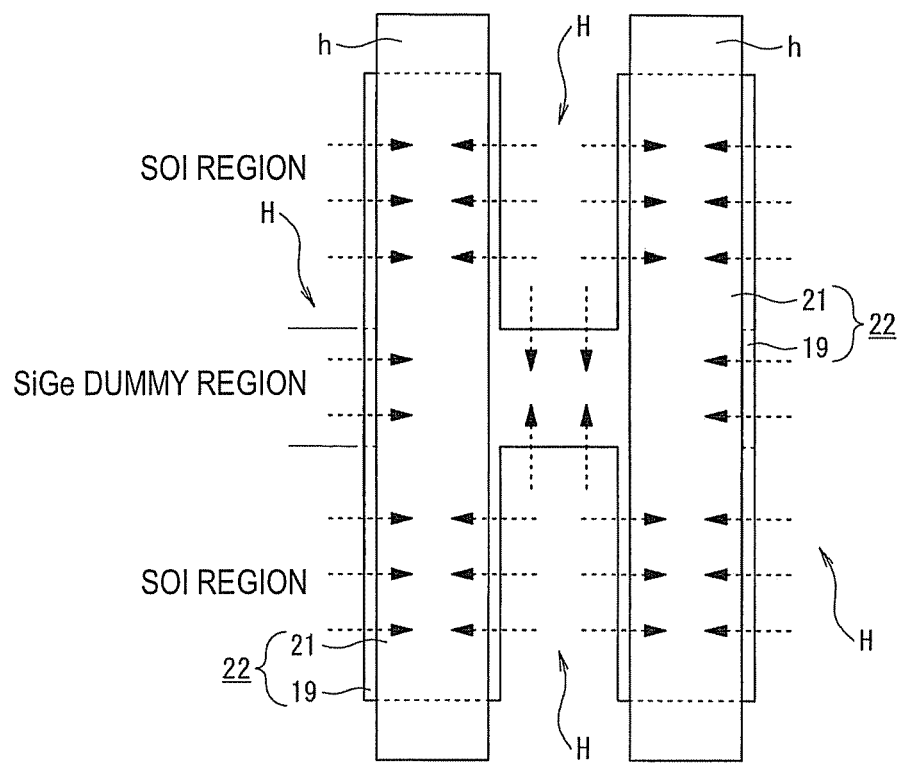
FIG. 13 is a diagram showing the method for manufacturing a semiconductor device according to the second embodiment (third step).

As shown with a dashed line in FIG. 13, an etchant such as a hydrofluoric-nitric acid solution is brought into contact with lateral surfaces of the Si layer 13 and the SiGe layer 11 through the groove H so as to selectively remove the SiGe layer 11. Thus a cavity is formed between the Si layer and the Si substrate in the SOI region.

Figure 14:
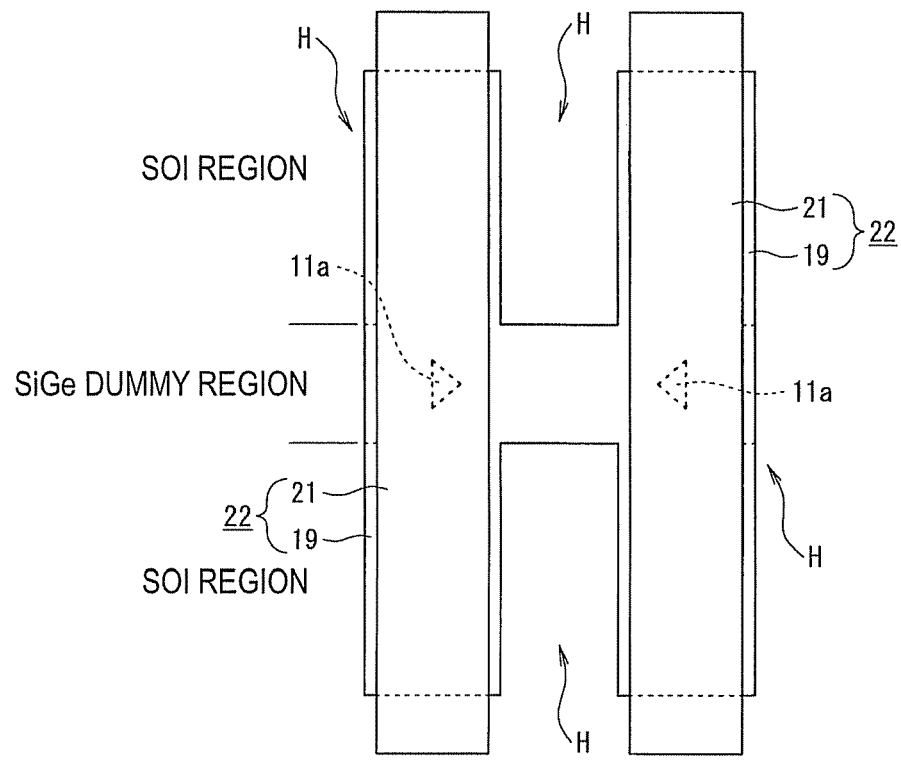
FIG. 14 is a diagram showing the method for manufacturing a semiconductor device according to the second embodiment (fourth step).

As shown in FIG. 14, the groove H is provided only on one side at a part covered by the support 22 in the SiGe dummy region, and the vicinity of the center part of the support 22 is far from the groove H, so that the hydrofluoric-nitric acid solution hardly enters. Therefore, the dummy pattern 11a serving as an anode is left at the vicinity of the center part even after the SiGe layer in the SOI region is completely removed, in the SiGe selective etching process. The Si layer and the Si substrate under the $Si_3N_4$ film 19 serve as a (excess electron) cathode until the SiGe selective etching is finished. Roughness caused by the etching on the upper surface of the Si substrate and the under surface of the Si layer that face the cavity can be restrained.

Figure 15:
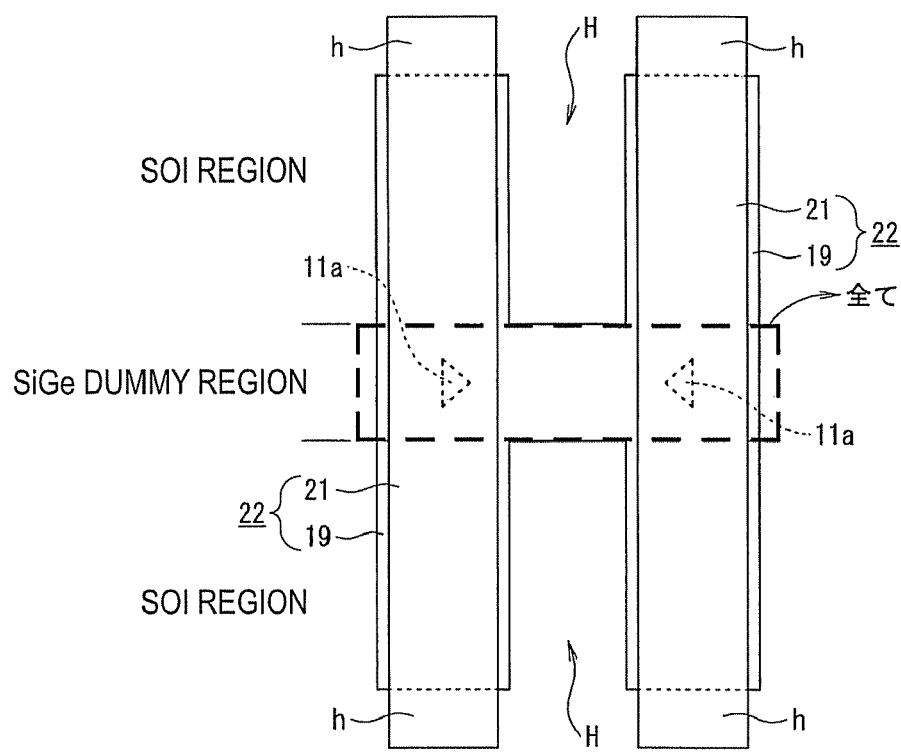
FIG. 15 is a diagram showing the method for manufacturing a semiconductor device according to the second embodiment (fifth step).

Then the Si substrate and the Si layer is thermally oxidized so as to form a $SiO_2$ film (that is, a BOX layer) in the cavity. After the BOX layer is formed, the SiGe dummy pattern 11a that is left in the SiGe dummy region is removed by photolithography and etching, as shown in FIG. 15. Here, the $SiO_2$ film 21, the $Si_3N_4$ film 19, the $SiO_2$ film, and the Si layer that are left in the SiGe dummy region may be removed together with the SiGe dummy pattern 11a.

Figure 16:
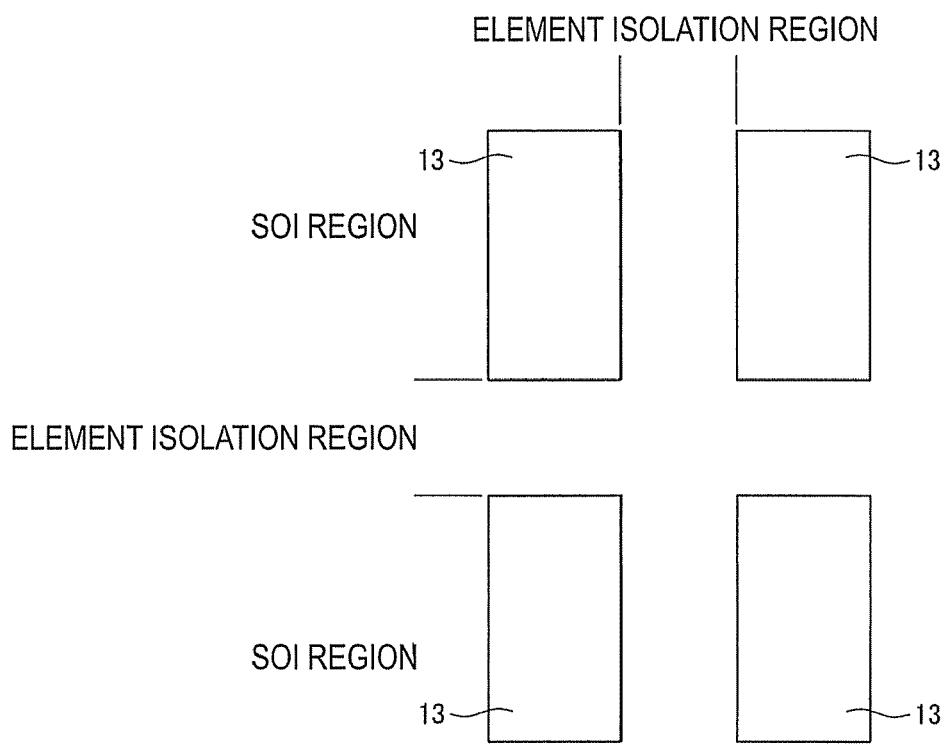
FIG. 16 is a diagram showing the method for manufacturing a semiconductor device according to the second embodiment (sixth step).

Subsequently, an insulating film is formed on the whole upper surface of the Si substrate in a manner filling the groove H and covering the Si substrate exposed in the dummy region by CVD, for example. The insulating film, for example, is a $SiO_2$ film or a silicon nitride ($Si_3N_4$) film. Then the insulating film and the $SiO_2$ film 21 formed on the whole upper surface of the substrate are planarized by CMP, for example. Further, the $Si_3N_4$ film 19 is wet-etched with, for example, hot phosphoric acid, and the $SiO_2$ film under the $Si_3N_4$ film 19 is wet-etched with, for example, diluted hydrofluoric acid solution. Thus an island-shaped Si layer (an SOI layer) 13 can be formed as shown in FIG. 16. Referring to FIG. 16, the insulating layer is formed on a part where the Si layer 13 is not formed, and serves as an element isolation layer.

Figure 17:
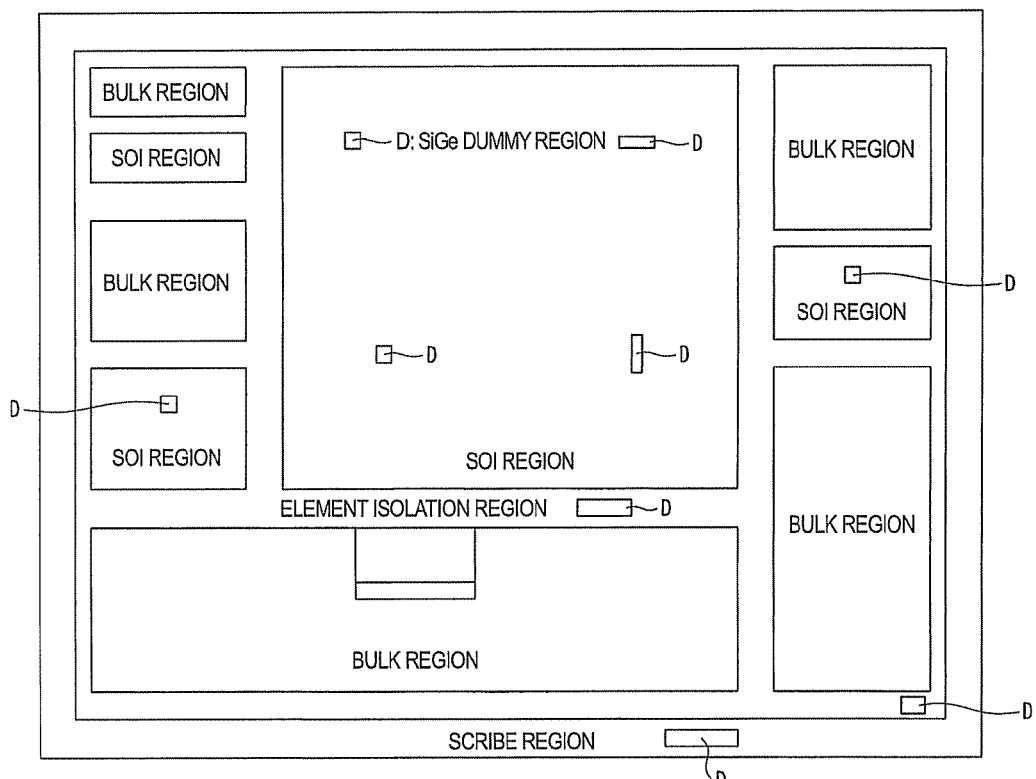
FIG. 17 is a diagram illustrating an arrangement of a SiGe dummy region D.

FIG. 17 is a diagram illustrating an arrangement of a SiGe dummy region D. As shown in FIG. 17, this SiGe dummy region D may be disposed in an element isolation region which is between the bulk region and the SOI region, may be disposed partially in the SOI region and the bulk region, or may be disposed in a scribe (line) region. Either, a SiGe dummy region which is not shown may be prepared at the under surface of the Si substrate so as to form the SiGe dummy pattern thereon.

In the second embodiment as well, since the lateral surfaces of the SiGe dummy pattern 11a are allowed to contact the etchant during the whole SiGe selective etching process, the oxidation number can be maintained low as is the case with the first embodiment. Accordingly, the deterioration of the etching selectivity of SiGe with respect to Si can be prevented and the roughness caused by etching on the upper surface of the Si substrate and the under surface of the Si layer that face the cavity can be prevented, as well.

The SOI region in the first and second embodiments exemplarily corresponds to an "element region" of the invention and the SiGe dummy region in the embodiments exemplarily corresponds to a "dummy region" of the invention. Further, the SiGe dummy pattern 11a in the embodiments exemplarily corresponds to a "dummy pattern" of the invention and the $SiO_2$ film 31 in the embodiments exemplarily corresponds to an "insulating film" of the invention.

A chemical solution (that is, an etchant) to etch the SiGe layer 11 is not limited to the hydrofluoric-nitric acid solution in the present invention. A mixed solution including $CH_3COOH$, HF, $HNO_3$, and $H_2O$ can be used as the etchant. Such etchant also can remove only the SiGe layer 11 while leaving the Si layer 13 because the etching rate of SiGe is higher than that of Si.

Further, the etchant is preferably used at a temperature of 50 degrees centigrade or more. For example, the hydrofluoric-nitric acid solution is heated to be 50 degrees centigrade or more inside or outside of an etching apparatus. Then the hydrofluoric-nitric acid solution is supplied to the surface of the Si substrate 1 before the temperature thereof decreases below 50 degrees centigrade, preferably etching and removing the SiGe layer. Further, it is preferable that the Si substrate 1 be heated to be 50 degrees centigrade or more as well as the etchant and the SiGe layer be etched before the temperature of the Si layer 1 decreases below 50 degrees centigrade. The temperatures of the etchant and the Si substrate 1 are controlled as the above, being able to supply a larger electric current either in a forward direction or a reverse direction at an interface between SiGe and Si substrate 1. Therefore, the large electric current can circulate in the order of the etchant, Si, and SiGe and repeat this circulation.

Further, each of a plurality of constituents included in the etchant above is preferably stored in a single state. Then in the process etching the SiGe layer 11, the constituents each stored in a single state are mixed immediately before the etching (within five minutes) so as to make the etchant, and the etchant is adjusted to be at a predetermined temperature. Thus the SiGe layer is preferably etched by the etchant of which the temperature is adjusted as above. According to the above, the etchant is prevented from deteriorating. Further, when the constituents stored in a single state (e.g. $CH_3COOH$, HF, $HNO_3$, and $H_2O$) are mixed, a temperature of the compound rises to from 40 to 50 degrees centigrade. Therefore, when the compound is controlled to be at a temperature of 50 degrees centigrade or more, an amount of heat required for heating the compound can be reduced. Thus an energy saving effect can be expected.

Furthermore, when the SiGe layer 11 is etched, a wet-etching apparatus of a spin rotation system may be used instead of a wet station of a dipping system, in the invention. The wet-etching apparatus of a spin rotation system sprays an etchant on the surface of the Si substrate 1 while rotating the Si substrate 1. In a case where the apparatus of a spin rotation system is used, liquid matters are supplied from nozzles in an alternate manner as the order of hydrofluoric nitric acid solution, purified water, diluted HF solution (or hydrogen peroxide), purified water, hydrofluoric nitric acid solution, purified water, and, for example, with respect to the surface of the Si substrate 1 rotating. Thus the SiGe layer 11 is preferably etched. According to the above method, for example, before concentration of nitrous acid in the hydrofluoric-nitric acid solution is increased, an old hydrofluoric-nitric acid solution can be removed once from the surface of the Si substrate 1. Thereafter, the hydrofluoric-nitric acid solution newly formed is supplied to the surface of the Si substrate 1 so as to etch the SiGe layer. Accordingly, it is easy to maintain nitrous acid in the hydrofluoric-nitric acid solution and a product produced by the etching to have less than or equal to a constant concentration, more assuredly preventing the etching selectivity ratio from deteriorating and preventing etching speed of the Si layer from increasing.

In the first and second embodiments, a case where the SiGe layer 11 and the Si layer 13 are singly layered on the Si substrate 1 is explained, but the invention is not limited to this case. It is also applicable to a method for manufacturing a semiconductor device in which a plurality of SiGe layers and Si layers are alternately layered, for example.

What is claimed is:

1. A method for manufacturing a semiconductor device, including:
   (a) forming a SiGe layer on a Si substrate;
   (b) forming a Si layer on the SiGe layer;
   (c) forming a dummy pattern made of SiGe in a dummy region of the Si substrate; and
   (d) wet-etching and removing the SiGe layer formed under the Si layer, wherein
   in the step (d), an etchant is kept to contact the dummy pattern from before a complete remove of the SiGe layer to an end of the etching.

2. The method for manufacturing a semiconductor device according to claim 1, wherein, in the step (d), the etchant is kept to contact the dummy pattern from a beginning of the etching to an end of the etching.

3. A method for manufacturing a semiconductor device, including:
   (e) forming a SiGe layer on a Si substrate;
   (f) forming a Si layer on the SiGe layer;
   (g) etching the Si layer and the SiGe layer partially so as to form a dummy pattern made of the SiGe layer in a dummy region of the Si substrate and form a groove exposing a lateral surface of the dummy pattern and a lateral surface of the SiGe layer in an element region; and
   (h) wet-etching the SiGe layer through the groove so as to form a cavity between the Si substrate and the Si layer in the element region, wherein
   in the step (h), an etchant is kept to contact the dummy pattern through the groove from a beginning of the etching to an end of the etching.

4. The method for manufacturing a semiconductor device according to claim 3, wherein the element region is a region for forming an SOI device,
   wherein a region for forming a bulk silicon device, an element isolation region, a region for forming a scrub line are prepared as well as the region for forming the SOI device on the Si substrate, and
   wherein the dummy region is prepared in at least one of the region for forming the SOI device, the region for forming the bulk silicon device, the element isolation region, and the region for forming the scrub line.

5. The method for manufacturing a semiconductor device according to claim 3, wherein, in the step (g), the dummy pattern is formed such that a part of the dummy pattern is left on the Si substrate in the dummy region even after the SiGe layer is completely removed from the Si substrate in the element region.

6. The method for manufacturing a semiconductor device according to claim 3, further comprising:

forming an insulating film in the cavity so as to fill the cavity; and etching and removing the dummy pattern after forming a cavity between the Si substrate and the Si layer in the element region.

7. The method for manufacturing a semiconductor device according to claim 1, wherein the etchant is made of a mixed solution including one of HF and $NH_4F$; $HNO_3$; and $H_2O$.

8. The method for manufacturing a semiconductor device according to claim 1, wherein the etchant is made of a mixed solution including $CH_3COOH$; one of HF and $NH_4F$; $HNO_3$; and $H_2O$.

* * * * *